(12) United States Patent
Miyajima

(10) Patent No.: US 7,319,510 B2
(45) Date of Patent: Jan. 15, 2008

(54) STAGE DEVICE, EXPOSURE APPARATUS USING THE UNIT, AND DEVICE MANUFACTURING METHOD

(75) Inventor: Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 139 days.

(21) Appl. No.: 11/286,780

(22) Filed: Nov. 23, 2005

(65) Prior Publication Data
US 2006/0113040 A1 Jun. 1, 2006

(30) Foreign Application Priority Data
Nov. 26, 2004 (JP) .............................. 2004-342251

(51) Int. Cl.
G03B 27/58 (2006.01)
G03B 27/62 (2006.01)
(52) U.S. Cl. .......................................... 355/72; 355/75
(58) Field of Classification Search ................. 355/53, 355/72–76; 310/10, 12; 318/640, 649
See application file for complete search history.

(56) References Cited

U.S. PATENT DOCUMENTS

| | | | |
|---|---|---|---|
| 4,742,286 A * | 5/1988 | Phillips | 318/640 |
| 6,285,102 B1 * | 9/2001 | Matsuoka et al. | 310/90 |
| 6,590,634 B1 * | 7/2003 | Nishi et al. | 355/53 |
| 6,987,335 B2 * | 1/2006 | Korenaga | 310/12 |
| 2004/0126907 A1 | 7/2004 | Korenaga | |

FOREIGN PATENT DOCUMENTS

| JP | 8-028564 A | 2/1996 |
|---|---|---|
| JP | 2004-254489 A | 9/2004 |

\* cited by examiner

*Primary Examiner*—Henry Hung Nguyen
(74) *Attorney, Agent, or Firm*—Canon USA Inc IP Division

(57) ABSTRACT

A stage device includes a plurality of bases positioned adjacent each other with a space therebetween, a plurality of stages movable along surfaces of the bases, and a plurality of gas bearings provided in each of the stages. The gas bearings extend in a direction in which the bases are adjacently arranged.

8 Claims, 16 Drawing Sheets

FIG. 6
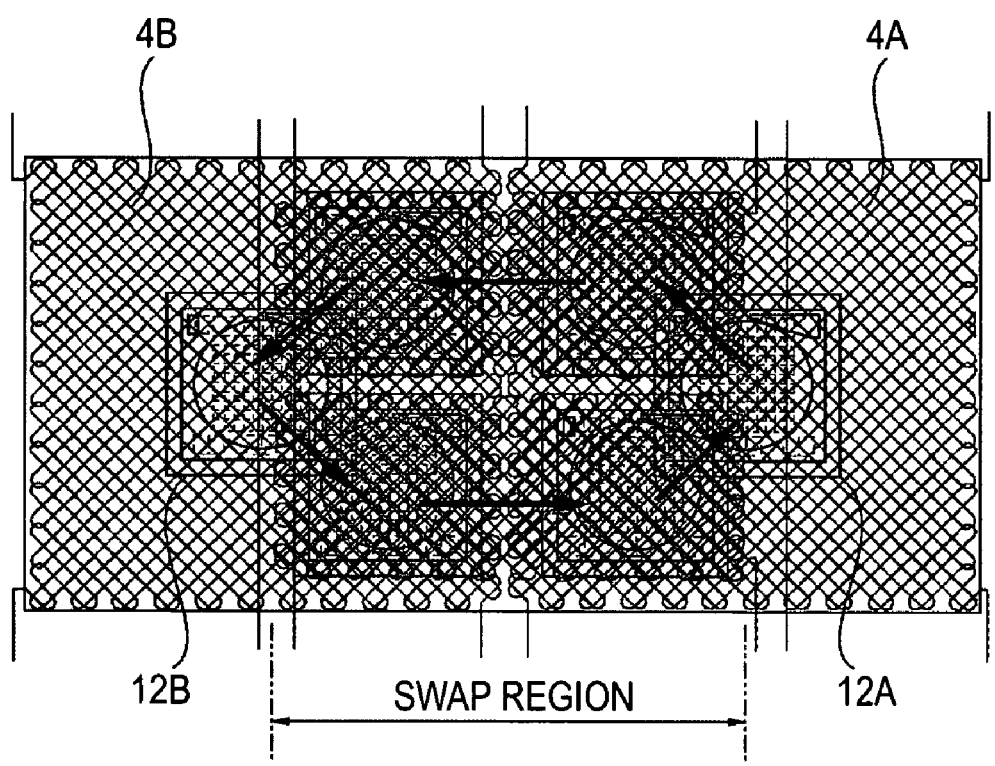
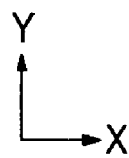

STAGE DEVICE, EXPOSURE APPARATUS USING THE UNIT, AND DEVICE MANUFACTURING METHOD

BACKGROUND OF THE INVENTION

1. Field of the Invention

The present invention relates to a stage device having a plurality of stages, and more particularly, to a stage device for use in an exposure apparatus.

2. Description of the Related Art

In recent years, various types of stage devices for use in exposure apparatuses have been developed in order to meet a demand to increase the speed and accuracy of exposure.

U.S. Pat. No. 2004/0126907 A1 discloses a stage mechanism that simultaneously performs exposure and alignment with two stages. It further discloses a stage device having a surface motor, in which only a stage with a wafer placed thereon is moved on a base in the X- and Y-directions. In this stage device, the stage is supported in the Z-direction in a non-contact manner by a levitation force based on a Lorentz force produced by energizing coils in the base. Japanese Patent Laid-Open No. H08-028564A discloses that a gas bearing is provided between the base and the stage to support the stage in such a manner.

In the stage mechanism, it is preferable that bases be separately disposed, respectively, in an exposure region and an alignment (measurement) region so that vibration due to movement of one of two stages does not adversely affect the other stage. In this case, when the stages are swapped between the exposure region and the alignment region, they pass over the space between the bases.

However, in a case in which a gas bearing is used to support the stages in the Z-direction, when a gas supply restriction of the gas bearing lies in the space between the separate bases, a sufficient levitation force is not ensured somewhere. If the levitation force is insufficient, the stages may touch the bases while moving above the bases.

When the stages are supported in the Z-direction by the application of a current to the coils, as in US Patent No. 2004/0126907 A1, a great force is needed to support the weights of the stages, and much heat is thereby generated by the coils. However, heat from the coils may deform components. And, when laser interferometers are used to measure the position of the stage, air fluctuates because of temperature nonuniformity in a measurement optical path. In both cases, accuracy is affected seriously.

SUMMARY OF THE INVENTION

The present invention provides a stage device including a plurality of bases positioned adjacent each other with a space therebetween, a plurality of stages movable along surfaces of the bases, and a plurality of gas bearings provided in each of the stages. The gas bearings extend in a direction in which the bases are arranged. According to the present invention, it is possible to stably support the wafer stages above the bases even during swapping while reducing the influence of vibration between the wafer stages.

Further features of the present invention will become apparent from the following description of exemplary embodiments with reference to the attached drawings.

BRIEF DESCRIPTION OF THE DRAWINGS

FIG. 6 is an explanatory view showing an exemplary swapping of wafer stages.

DESCRIPTION OF THE EMBODIMENTS

First Exemplary Embodiment

Figure 1:
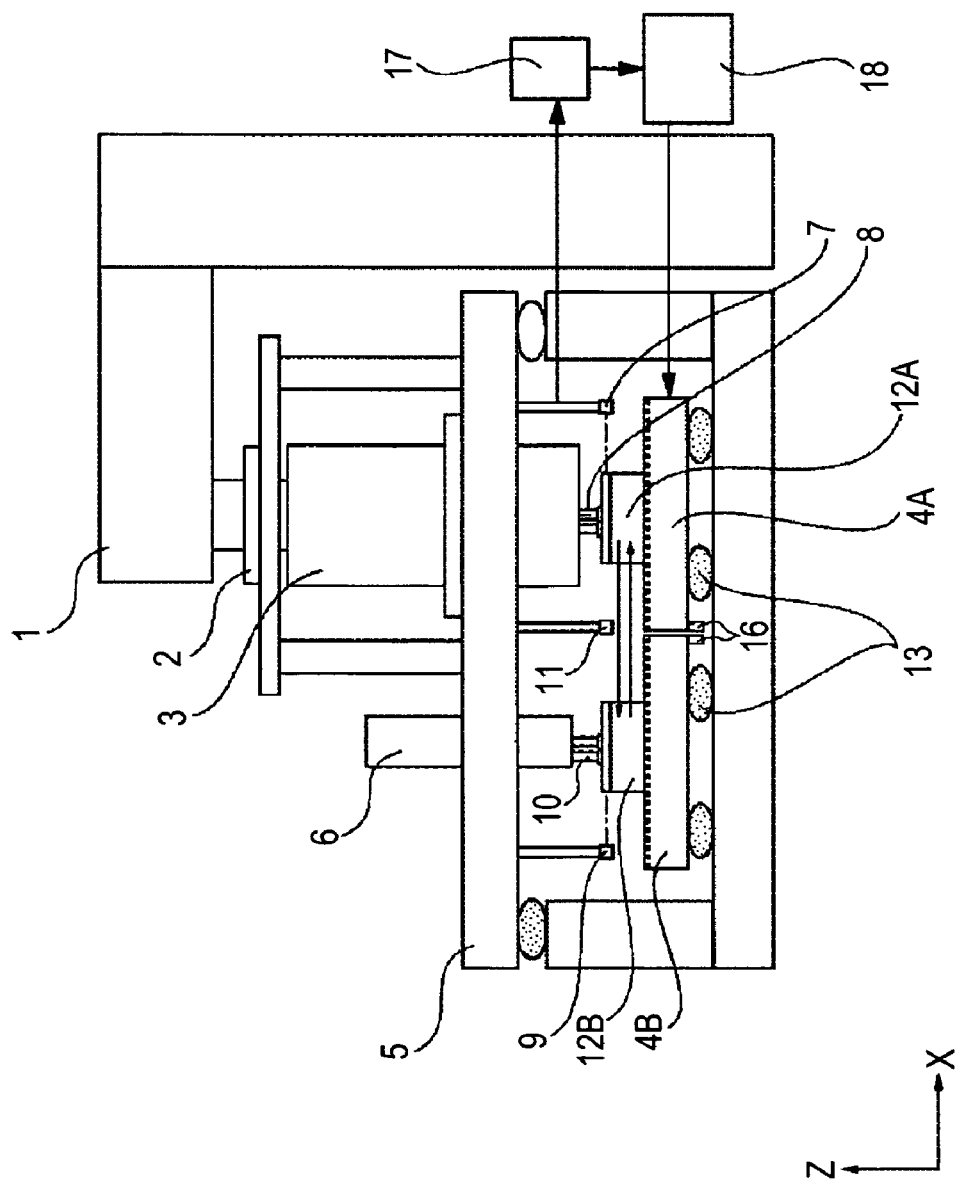
FIG. 1 is a general view of an exemplary exposure apparatus according to an embodiment of the present invention.
Figure 2:
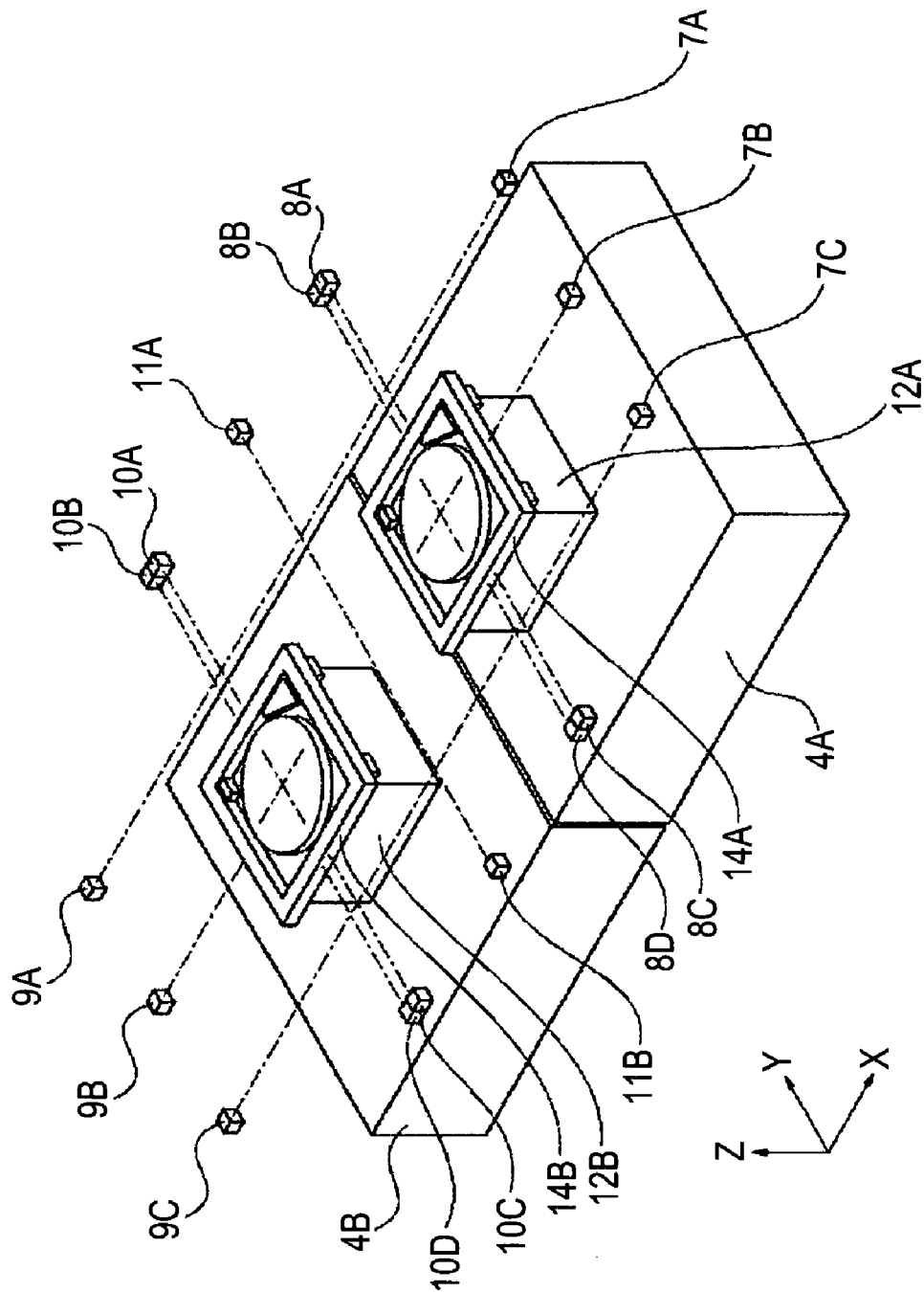
FIG. 2 is a perspective view of an exemplary stage device in the exposure apparatus.

A first embodiment of the present invention will be described below with reference to the drawings. FIG. 1 is a general view of an exemplary exposure apparatus according to the first embodiment, and FIG. 2 is a perspective view of wafer stages in the exposure apparatus.

In the exposure apparatus shown in FIG. 1, exposure light is emitted from an illumination unit 1. The light passes through a reticle (not shown) having an exposure pattern, and is applied onto a wafer (not shown) via a projection optical system 3. The exposure light is shaped like a slit. A reticle stage 2 on which the reticle is mounted, and wafer stages 12A and 12B on each of which a wafer is mounted are scanned in the width direction of the slit, thus obtaining a wide angle of view. The projection optical system 3 includes a plurality of lenses which are configured to project the exposure pattern of the reticle onto the wafer in a reduced size.

An alignment optical system 6 is provided to align a shot region on the wafer with the exposure pattern of the reticle. The alignment optical system 6 detects an alignment mark on the wafer and a reference mark on the wafer stage, and positions shot regions on the wafer and aligns the wafer and the reticle on the basis of the detected marks.

The wafer stages 12A and 12B move below the projection optical system 3 (in an exposure region) to subject the wafer to exposure, and move below the alignment optical system 6 (in an alignment region) for alignment. The wafer stages 12A and 12B are movable, respectively, on separate bases 4A and 4B in the X- and Y-directions. The bases 4A and 4B are supported by mounts 13.

The projection optical system 3 and the alignment optical system 6 are both supported by a support 5. The support 5 includes laser interferometers 7 to 11 that measure the positions of the wafer stages 12A and 12B by applying laser light onto mirrors 14A and 14B provided on the wafer stages 12A and 12B. As shown in FIG. 2, X-interferometers 7A to 7C measures the X-direction position of a wafer stage placed on the base 4A in an exposure region. X-interferometers 9A to 9C measure the X-direction position of a wafer stage placed on the base 4B in an alignment region. Y-interferometers 8A to 8D measure the Y-direction position of the wafer stage on the base 4A in the exposure region. Similarly, Y-interferometers 10A to 10D measure the Y-direction position of the wafer stage on the base 4B in the alignment region. The position of the wafer stage in the direction of rotation about the Z-axis can be measured by two interferometers (for example, interferometers 8A and 8B) arranged side by side in the X-direction. Y-interferometers 11A and 11B are provided between the exposure region and a measurement region so that the measurement is not interrupted even when two wafer stages are swapped.

An exemplary method for measuring the position during swapping will be described below. A gas bearing is provided on a bottom surface of each of the wafer stages 12A and 12B to support the wafer stage out of contact with the base. This support method will be described in detail below.

Figure 3:
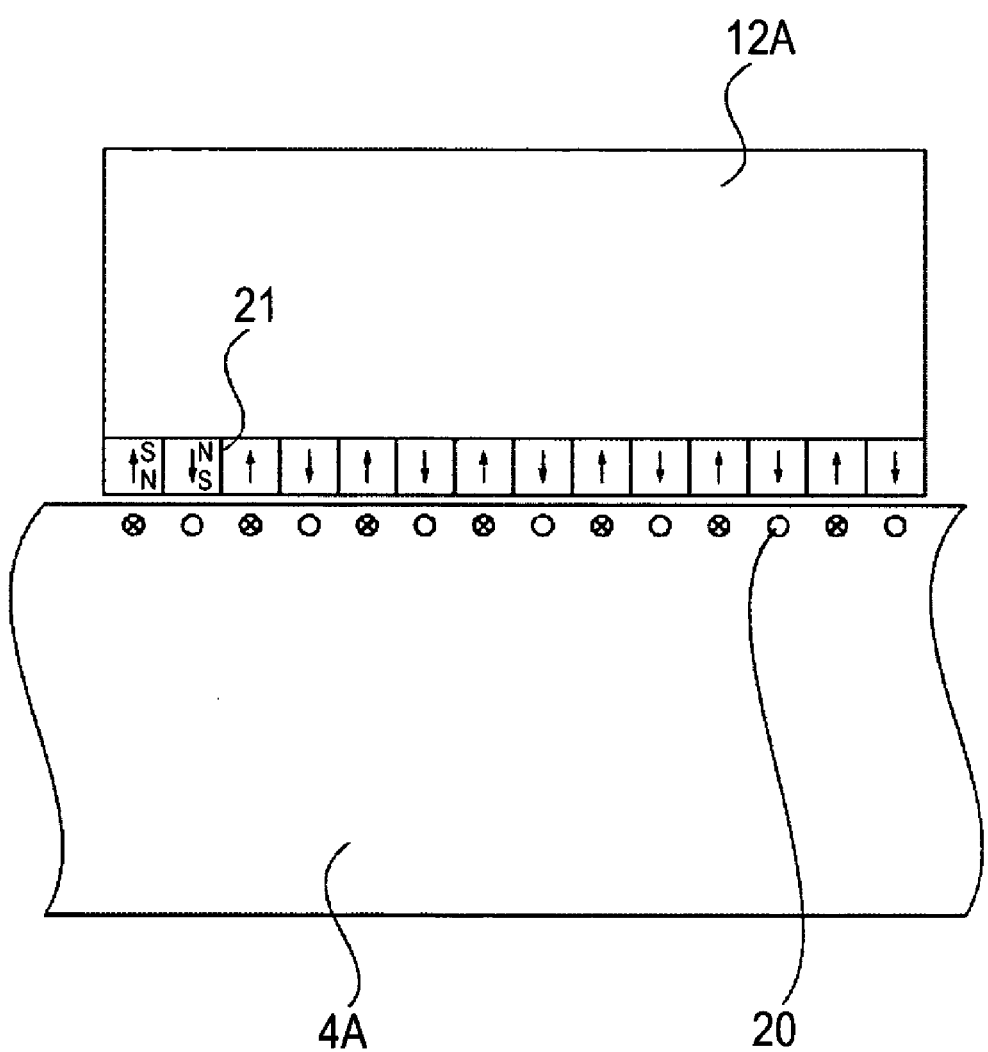
FIG. 3 is a cross-sectional view of an exemplary surface motor using a Lorentz force.
Figure 4A:
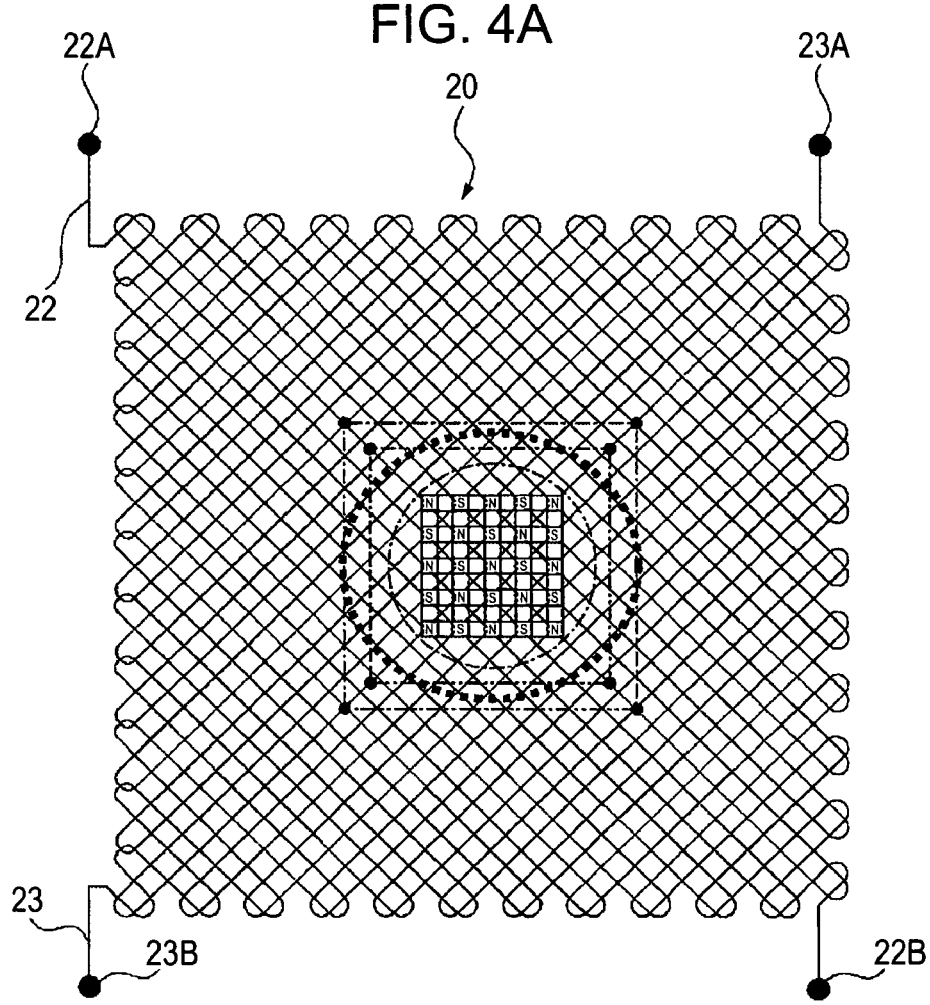
FIGS. 4A and 4B are explanatory views of an exemplary coil unit in the surface motor.

FIGS. 3 and 4 show, in particular, an exemplary wafer stage 12A which includes a magnet unit 21 in which N-poles and S-poles are alternately arranged so as to oppose the base 4A. The wafer stage 12A is moved in the X- and Y-directions by a Lorentz force produced by energizing a coil unit 20 provided on the base 4A. In the coil unit 20, coils 22 and 23 are each folded to form linear portions extending in parallel in predetermined directions, as shown in FIG. 4A. The distance between the linear portions is determined by the distance between the magnetic poles in the magnet unit 21. The linear portions of the coil 22 and the linear portions of the coil 23 are orthogonal to each other in a plane.

Figure 4B:
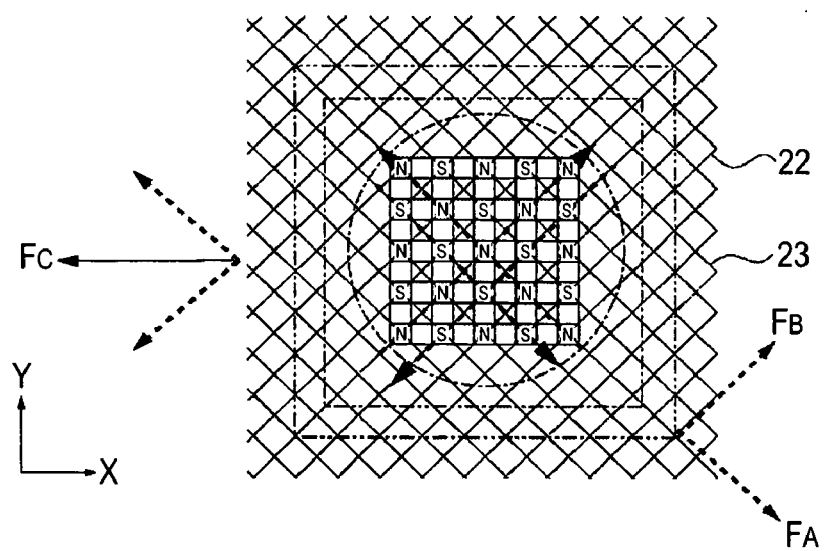

The coil 22 has terminals 22A and 22B at both ends, and the coil 23 has terminals 23A and 23B at both ends. A current can be applied to the coils 22 and 23 via the terminals. FIG. 4B shows a state in which a current is applied. When a current is applied to the coils 22 and 23 in the directions of the arrows while the wafer stage 12A is placed at a position shown in FIG. 3, a thrust $F_A$ is produced in the coil 22 and a thrust $F_B$ is produced in the coil 23 by the Lorentz law. Magnetic flux passes through the coil toward the front planar side (of FIGS. 4A-B) at the N-poles, and toward the rear planar side (of FIGS. 4A-B) thereof at the S-poles. Since the coils 22 and 23 are fixed to the base 4A, a thrust $F_C$ opposite to a resultant force of the thrusts $F_A$ and $F_B$ acts on the wafer stage 12A.

Further, a thrust acting in a predetermined direction can be produced in the wafer stage by switching the direction of the current to be applied, depending on the position of the wafer stage.

The above-described driving mechanism is applicable to both the wafer stage disposed in the exposure region and the wafer stage disposed in the alignment region. A description will now be given of a driving mechanism that operates to swap wafer stages between the exposure region and the alignment region.

Figure 5A:
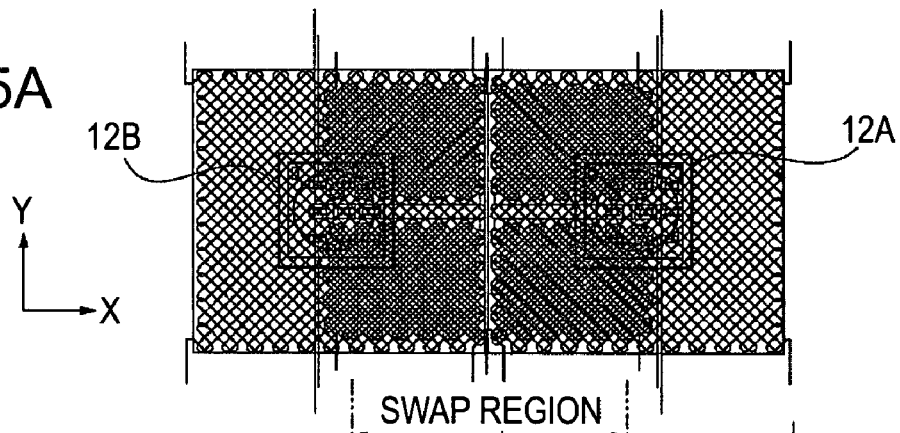
FIGS. 5A to 5D are explanatory views showing an exemplary arrangement of coil units.
Figure 5B:
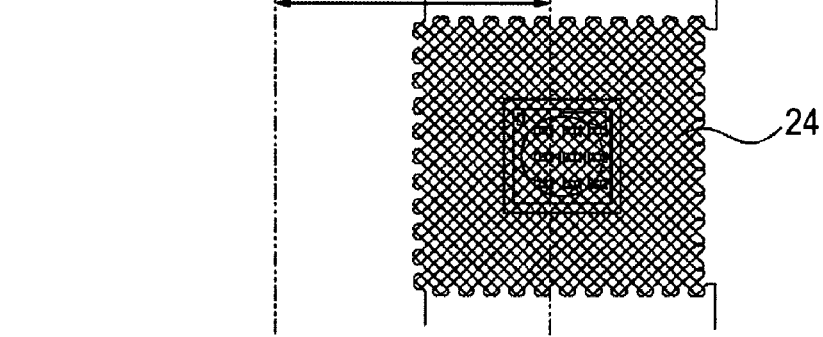
Figure 5C:
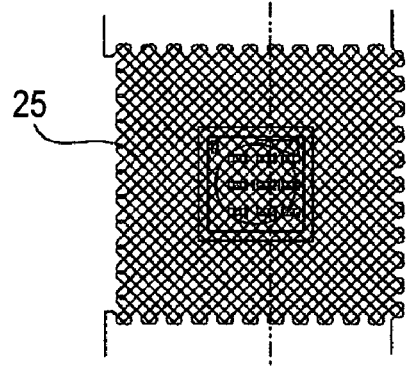
Figure 5D:
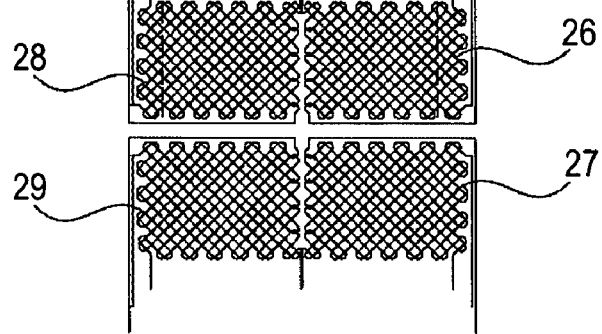

FIGS. 5A to 5D show an exemplary arrangement of coil units. The base 4A includes an exposure-region coil unit 24, and swap-region coil units 26 and 27 disposed in a swap region in which the wafer stages 12A and 12B are swapped, and the base 4B includes an alignment-region coil unit 25, and swap-region coil units 28 and 29 disposed in the swap region. As shown in FIG. 5A, coil units 26 to 29 overlap with the exposure-region coil unit 24 and the alignment-region coil unit 25.

A method for driving the two wafer stages 12A and 12B by using the swap-region coil units 26 to 29 will be described with reference to FIG. 6. The wafer stages 12A and 12B are swapped, as shown by the arrows in FIG. 6. That is, the wafer stages 12A and 12B are respectively moved in the +Y-direction and the −Y-direction to the positions in a swap region such they will not touch later, and are then moved in the +X-direction and the −X-direction. Since the swap-region coil units 26 to 29 are separate in the Y-direction, currents to be applied to the coils disposed below the wafer stages 12A and 12B can be controlled independently, and therefore, the wafer stages 12A and 12B can be moved independently.

The coil units 26 to 29 have a structure similar to that of the coil unit 20 shown in FIGS. 4A and 4B. The coils of the coil units are energized according to information about the positions of the wafer stages 12A and 12B. Referring to FIG. 1, information about the positions of the wafer stages 12A and 12B obtained by the interferometers is sent to a stage control system 18 via an interferometer system 17. On the basis of the sent position information and target positions, the stage control system 18 determines which coils on the wafer stages and the reticle stage are to be energized and the current values to be applied, and applies currents to the coils through a driver.

A sequence in which the wafer stages 12A and 12B are swapped in the above-described configuration will now be described with reference to FIGS. 7 and 8A to 8F.

Figure 7:
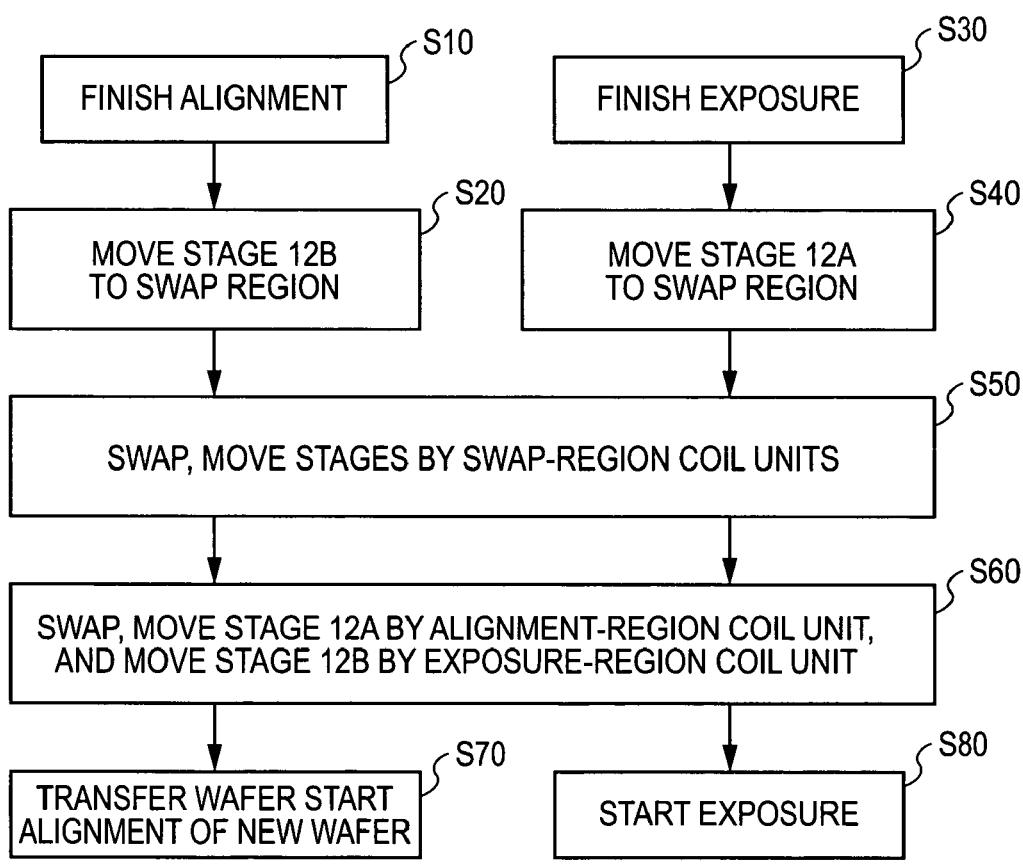
FIG. 7 is a flowchart showing an exemplary wafer-stage swapping sequence.
Figure 8A:
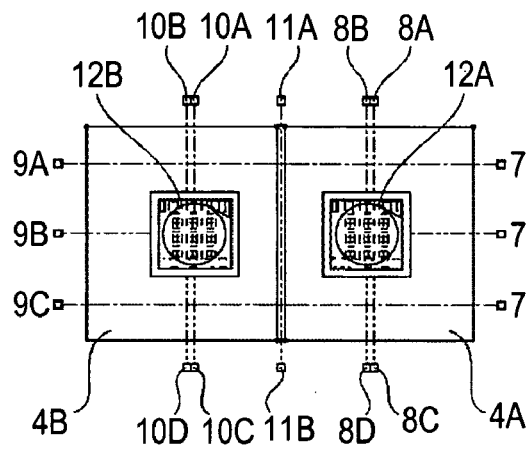
FIGS. 8A to 8F are explanatory views showing an exemplary position measurement during swapping of the wafer stages.

FIG. 8A shows a state in which exposure of a wafer on the wafer stage 12A and alignment of a wafer on the wafer stage 12B are completed (Steps S10 and S30 from FIG. 7). Subsequently, the wafer stages 12A and 12B are moved in the directions of the arrows in FIG. 8B to reach the positions in a swap region shown in FIG. 8C (Steps S20 and S40). In this case, the wafer stage 12A on the base 4A is moved by using the exposure-region coil unit 24, and the wafer stage 12B on the base 4B is moved by using the alignment-region coil unit 25 (Step S50).

Figure 8D:
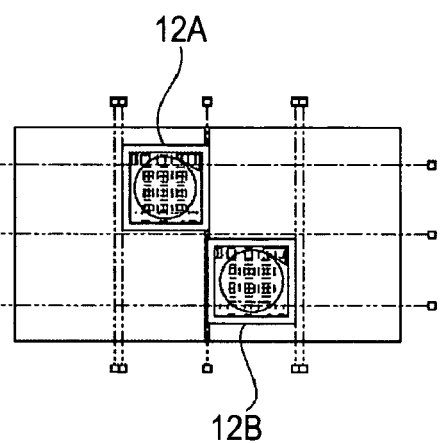
Figure 8B:
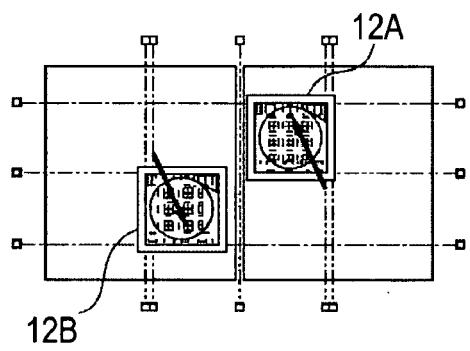
Figure 8E:
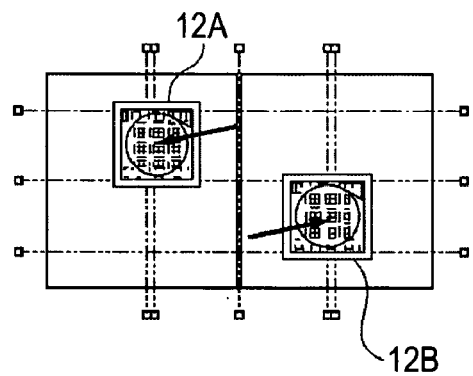
Figure 8C:
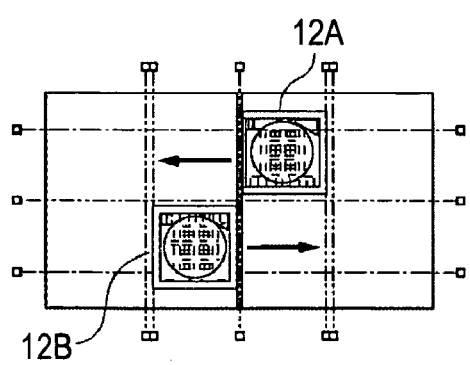

After reaching the swap region, the wafer stages 12A and 12B are moved in the directions of the arrows in FIG. 8C. Then, the wafer stages 12A and 12B are respectively moved into the alignment region and the exposure region by the swap-region coil units 26 to 29, as shown in FIG. 8D.

Subsequently, switching is made to use the exposure-region coil unit 24 and the alignment-region coil unit 25 again (Step S60). The wafer stage 12A is moved to an initial position for alignment, and the wafer stage 12B is moved to an initial position for exposure. Then, the wafer stage 12A receives a wafer at a transfer position (not shown) and starts alignment, and the wafer stage 12B starts exposure (Steps S70 and S80).

A description will now be given of a manner in which switching among the interferometers that measure the positions of the wafer stages in the X- and Y-directions is made during the above operations.

In the state shown in FIG. 8A, the X-direction position of the wafer stage 12A is measured with the X-interferometer 7B, the Y-direction position is measured with the Y-interferometers 8A and 8B, and the position in the direction of rotation about the Z-axis is measured with the Y-interferometer 8A or 8B. The X-direction position of the wafer stage 12B is measured with the X-interferometer 9B, the Y-direction position is measured with the Y-interferometer 10C or 10D, and the position in the direction of rotation about the Z-axis is measured with the Y-interferometers 10C and 10D.

In FIG. 8B, the X-direction position of the wafer stage 12A is measured with the X-interferometers 7A and 7B, the Y-direction position is measured with the Y-interferometer 8A or 8B, and the position in the direction of rotation about the Z-axis is measured with the Y-interferometers 8A and 8B. The X-direction position of the wafer stage 12B is measured with the X-interferometers 9B and 9C, the Y-direction position is measured with the Y-interferometer 10C or 10D, and the position in the direction of rotation about the Z-axis is measured with the Y-interferometers 10C and 10D.

In FIG. 8C, the X-direction position of the wafer stage 12A is measured with the X-interferometer 7A, the Y-direction position is measured with the Y-interferometer 8B or 11A, and the position in the direction of rotation about the Z-axis is measured with the Y-interferometers 8B and 11A. The X-direction position of the wafer stage 12B is measured with the X-interferometer 9C, the Y-direction position is measured with the Y-interferometer 10C or 11B, and the position in the direction of rotation about the Z-axis is measured with the Y-interferometers 10C and 11B.

In FIG. 8D, the X-direction position of the wafer stage 12A is measured with the X-interferometer 7A, the Y-direction position is measured with the Y-interferometer 11A or 10A, and the position in the direction of rotation about the Z-axis is measured with the Y-interferometers 11A and 10A. The X-direction position of the wafer stage 12B is measured with the X-interferometer 9C, the Y-direction position is measured with the Y-interferometer 11B or 8D, and the position in the direction of rotation about the Z-axis is measured with the Y-interferometers 11B and 8D.

In FIG. 8E, the X-direction position of the wafer stage 12A is measured with the X-interferometers 9A and 9B, the Y-direction position is measured with the Y-interferometer 10A or 10B, and the position in the direction of rotation about the Z-axis is measured with the Y-interferometers 10A and 10B. The X-direction position of the wafer stage 12B is measured with the X-interferometers 7C and 7B, the Y-direction position is measured with the Y-interferometer 8C or 8D, and the position in the direction of rotation about the Z-axis is measured with the Y-interferometers 8C and 8D.

Figure 8F:
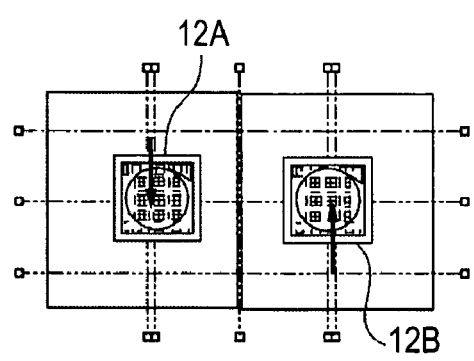

In FIG. 8F, the X-direction position of the wafer stage 12A is measured with the X-interferometer 9B, the Y-direction position is measured with the Y-interferometer 10A or 10B, and the position in the direction of rotation about the Z-axis is measured with the Y-interferometers 10A and 10B. The X-direction position of the wafer stage 12B is measured with the X-interferometer 7B, the Y-direction position is measured with the Y-interferometer 8C or 8D, and the position in the direction of rotation about the Z-axis is measured with the Y-interferometers 8C and 8D.

By switching among a plurality of interferometers in the above configuration, the positions of the wafer stages can be continuously measured, and can be changed between the exposure region and the alignment region.

The bases 4A and 4B on which the wafer stages 12A and 12B are mounted will now be described. Referring again to FIG. 1, the bases 4A and 4B are separately arranged with a space provided therebetween, and are independently supported by the mounts 13. Position sensors 16 are provided to detect the relative positions of the bases 4A and 4B in the X-, Y-, and Z-directions.

A difference in height between upper surfaces of the bases 4A and 4B is reduced by controlling a driving mechanism (linear motors or air cylinders) provided in the mounts 13 according to signals output from the position sensors 16.

Figure 9A:
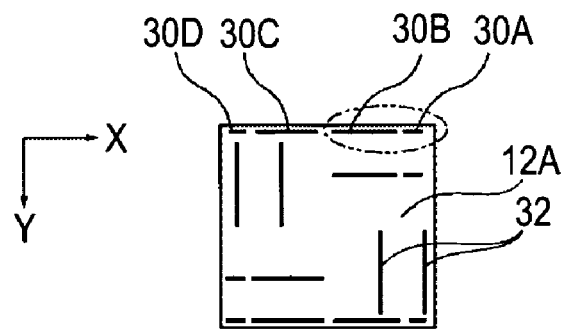
FIGS. 9A to 9C are bottom views of one of the exemplary wafer stages.
Figure 9B:
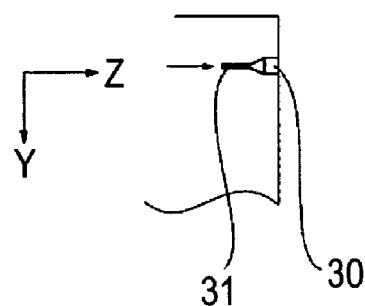
Figure 9C:
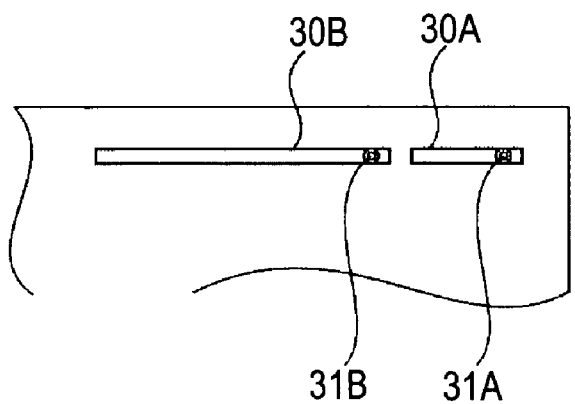

As previously discussed, each of the wafer stages 12A and 12B is supported in a non-contact manner by a levitation force. The levitation force is obtained by jetting pressurized gas onto the upper surface of the base 4A or 4B with the gas bearing provided on the bottom surface of the wafer stage. FIGS. 9A to 9C show the gas bearing.

The gas bearing is a surface restriction gas bearing, and includes a groove 30 and a gas supply hole 31, as shown in FIG. 9B. The groove 30 includes a plurality of grooves extending in the X-direction, as shown in FIG. 9A. FIG. 9C shows one of the grooves 30. The groove 30 includes a section 30A and a section 30B that are separate in the longitudinal direction. The sections 30A and 30B have gas supply holes 31A and 31B, respectively.

Figure 10A:
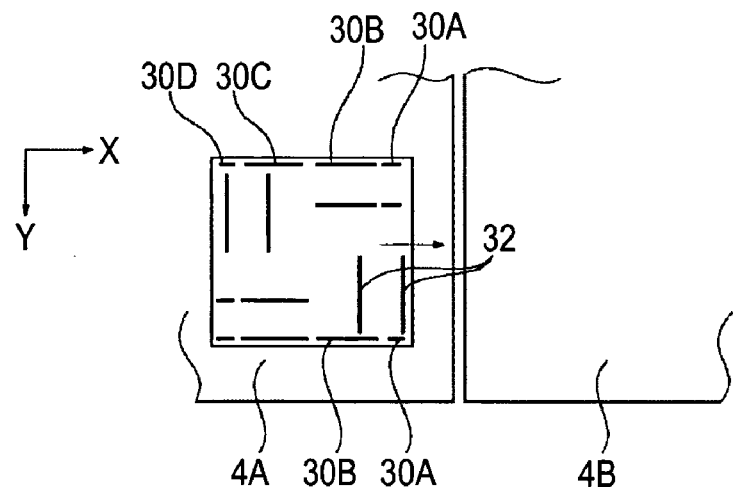
FIGS. 10A to 10C are explanatory views showing how the wafer stage moves above bases.
Figure 10B:
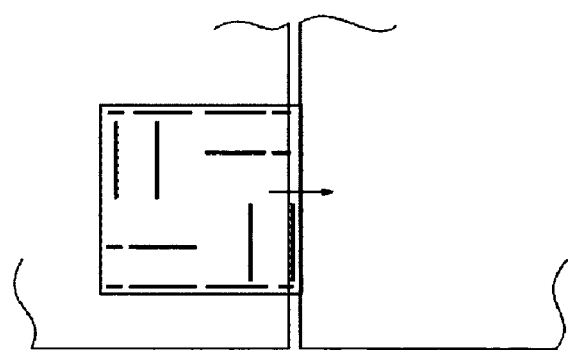
Figure 10C:
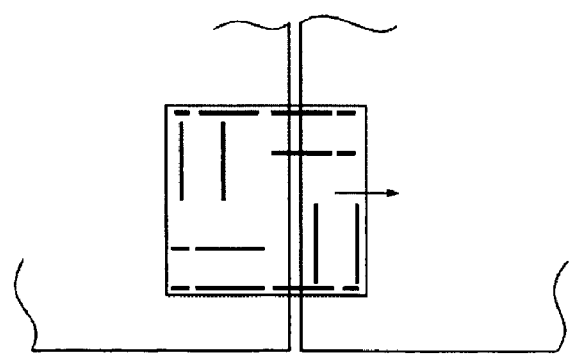

FIGS. 10A to 10C show how the wafer stage 12 moves between the two bases 4A and 4B. When the wafer stage 12 moves from a position shown in FIG. 10A to a position shown in FIG. 10B, part of the section 30A lies in the space between the bases 4A and 4B. In this state, gas leaks, and the support rigidity of the gas bearing is reduced. However, the section 30B is separate from the section 30A, and therefore, the wafer stage 12 can move along the upper surfaces of the bases 4A and 4B.

When the wafer stage 12 further moves from the position shown in FIG. 10B to a position shown in FIG. 10C, part of the section 30B lies in the space between the bases 4A and 4b. In this state, gas leaks, and the support rigidity of the gas bearing is reduced. However, the section 30A is separate from the section 30B, and therefore, the wafer stage 12 can move along the upper surfaces of the bases 4A and 4B.

In the first embodiment, the stage device that moves above the two separate bases 4A and 4B includes the long groove 30 extending in the direction in which the bases 4A and 4B are arranged (X-direction), and the gas supply hole 31 provided in the groove 30. The groove 30 includes sections 30A and 30B that are separated in the longitudinal direction. Further, the sections 30A and 30B have gas supply holes 31A and 31B, respectively. Therefore, the wafer stage 12 can be stably supported while moving between the bases 4A and 4B. The distance between the sections 30A and 30B can be longer than the distance between the bases 4A and 4B.

A plurality of grooves 32 can be arranged in the Y-direction. This allows the wafer stage to be supported more stably. A plurality of grooves 32 extending in the Y-direction can be arranged in different positions about the X-direction. In this case, even when gas leaks from the section 30A (or 30B), a sufficient support rigidity is ensured by the section 30B (or 30A) and the grooves 32. The grooves 32 can be provided on both sides in the X-direction of the center region (the center of gravity) of the wafer stage 12, and the grooves 32 can be arranged substantially symmetrically with respect to the center region (the center of gravity).

According to the above-described first embodiment, the wafer stages can be stably supported above the bases even during swapping while reducing the influence of vibration therebetween.

Second Exemplary Embodiment

Figure 11A:
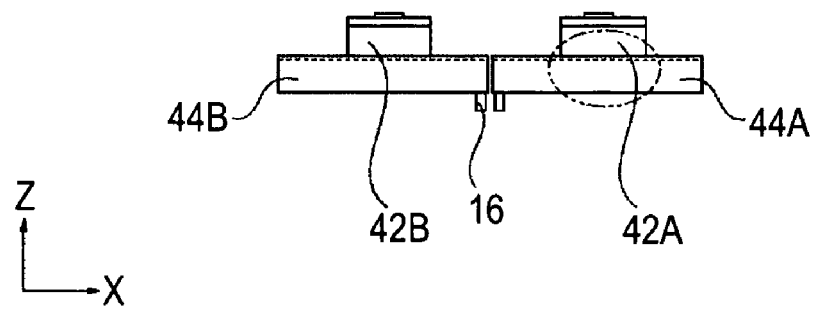
FIGS. 11A and 11B are schematic views of an exemplary planar pulse motor.

While the above first embodiment adopts the surface motor using a Lorentz force, the surface motor may be driven by other methods. FIG. 11A shows a surface motor that is driven on a principle similar to that of a linear pulse motor (i.e., Sawyer pulse driven motor). Wafer stages 42A and 42B are respectively supported above two bases 44A and 44B in a non-contact manner by gas bearings. Components similar to those in the first embodiment are denoted by the same reference numerals, and detailed descriptions thereof are omitted.

Figure 11B:
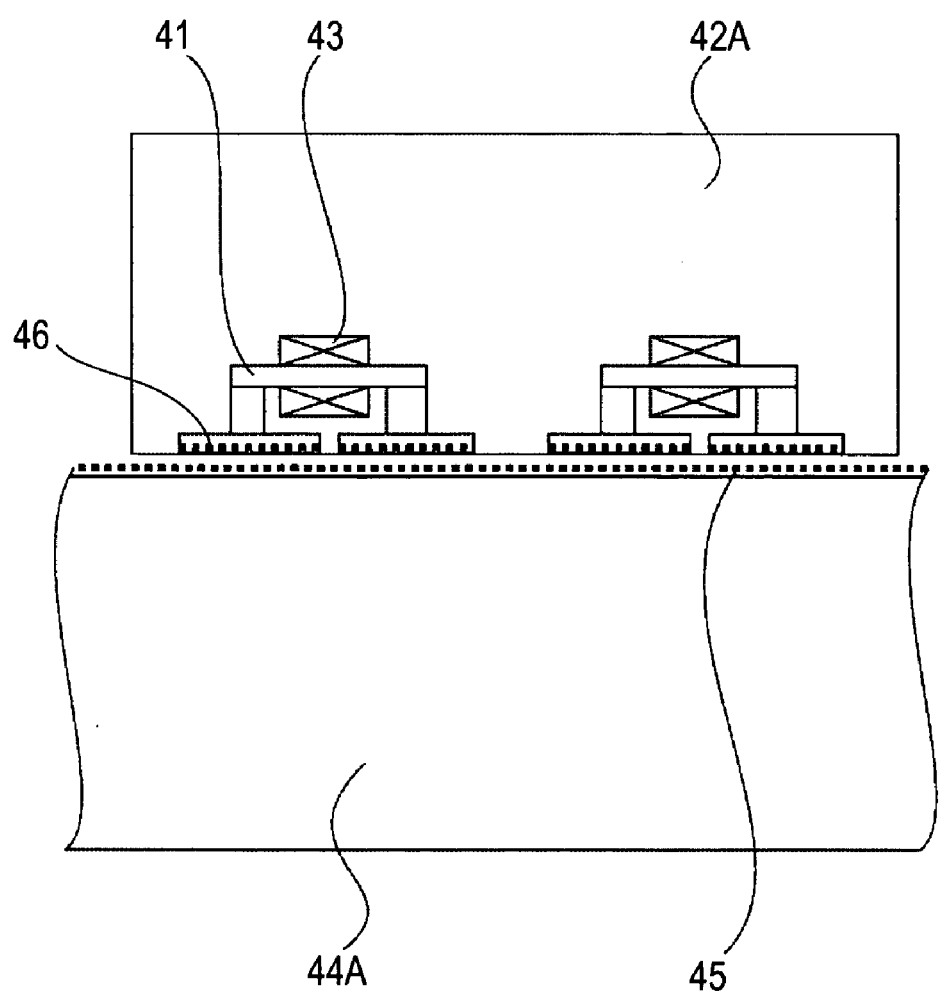

FIG. 11B shows the wafer stage 42A and the base 44A. The base 44A has a comb-shaped metallic (e.g., iron) portion 45 on its upper surface, and the wafer stage 42A includes yokes 41 each having a comb-shaped metallic (e.g., iron) portion 46, and coils 43 provided in the yokes 41. When a current is passed through the coils 43, the yokes 41 are excited, and an attractive force is produced between the metallic portions 45 and 46 of the base 44A and the yokes 41. The wafer stage 42A can be moved along the upper surface of the base 44A by using the attractive force while switching among the coils 43 to be energized and changing the direction of the current.

Figure 12A:
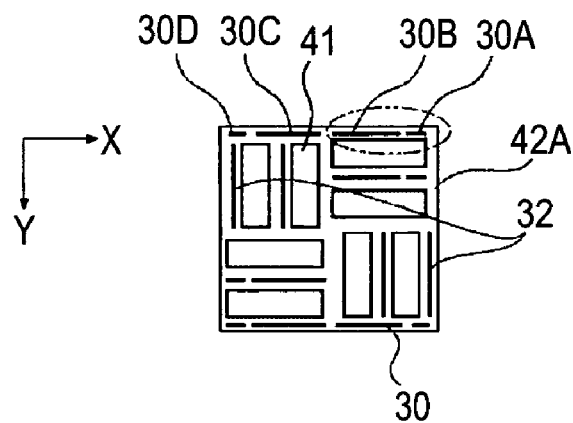
FIGS. 12A to 12C are bottom views of an exemplary wafer stage when the planar pulse motor is used.
Figure 12B:
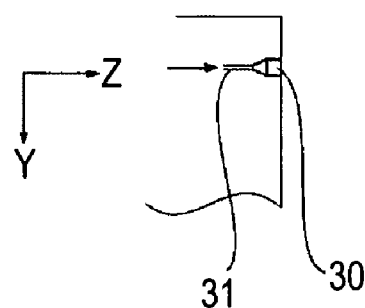
Figure 12C:
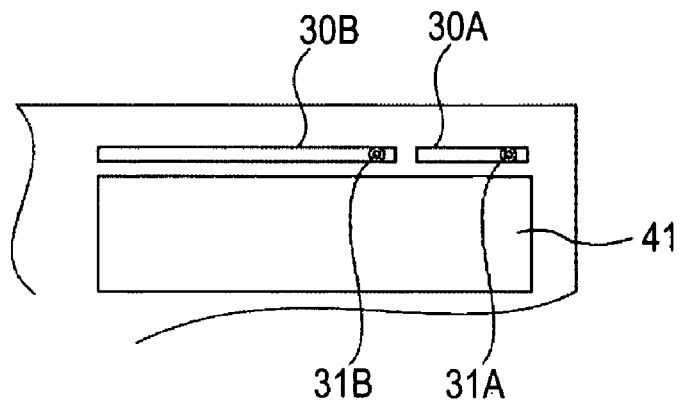

FIG. 12A is a bottom view of the wafer stage 42A. The gas bearing provided on the wafer stage 42A is a surface restriction gas bearing, and includes a plurality of grooves 30A-D extending in the X-direction. FIG. 12C shows one of the grooves 30 which includes a section 30A and a section 30B that are separate from each other in the longitudinal direction. Further, it is noted that sections 30A and 30B have gas supply holes 31A and 31B, respectively.

In the second embodiment, the stage device that moves above the two separate bases 44A and 44B includes the long groove 30 extending in the direction in which the bases 44A and 44B are arranged (X-direction), and the gas supply hole 31 provided in the groove 30. Therefore, the wafer stage 42 can be stably supported even when it moves between the bases.

The distance between the sections 30A and 30B can be longer than the distance between the bases 44A and 44B. A plurality of grooves 30 can be arranged in the Y-direction. This allows the wafer stage 42 to be supported more stably. A plurality of grooves 32 extending in the Y-direction can be arranged in the X-direction. In this case, even when gas leaks from the section 30A (or 30B), a sufficient support rigidity can be ensured by the section 30B (or 30A) and the grooves 32. The grooves 32 can be provided on both sides in the X-direction of the center region (the center of gravity) of the wafer stage 42, and the grooves 32 can be arranged substantially symmetrically with respect to the center region (the center of gravity) of the wafer stage 42.

According to the above-described second embodiment, the wafer stages can be stably supported above the bases even during swapping while reducing the influence of vibration therebetween.

Third Exemplary Embodiment

While the wafer stages are moved by the surface motor in the above-described embodiments, a similar gas bearing can be provided in a stage device having guides.

FIGS. 13A to 13D show a stage device having guides. The stage device includes a Y-driving mechanism 51A-B for moving wafer stages in the Y-direction, an X-driving mechanism 53A-B for moving the Y-driving mechanism 51 in the X-direction, and bases 54A and 54B for respectively supporting wafer stages 52A and 52B so that the wafer stages 52A and 52B can move in the X- and Y-directions. The bases 54A and 54 are provided in an exposure region and an alignment region, respectively, and are independently supported by mounts. This reduces the influence of a reactive force and vibration produced between the wafer stages 52A and 52B during movement thereof.

Figure 13A:
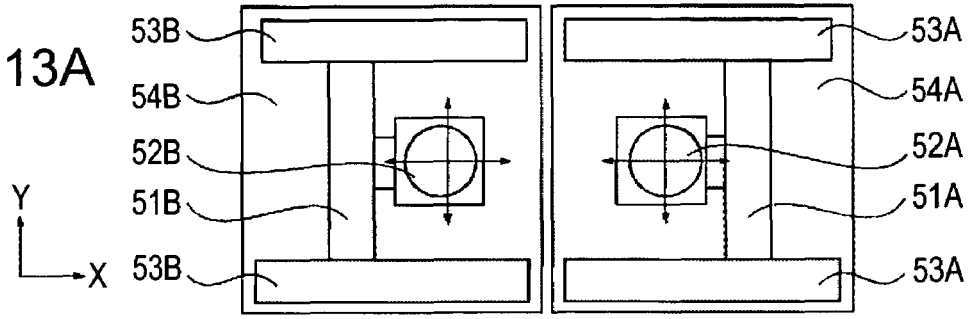
FIGS. 13A to 13D are explanatory views of an exemplary stage device having guides.

A description will be given of an operation for swapping the wafer stages 52A and 52B in the stage device having the guides, with reference to FIGS. 13A through 13D. In FIG. 13A, exposure is performed in the exposure region, and alignment is performed in the alignment region. In order to move an aligned wafer from the alignment region to the exposure region and to remove an exposed wafer from the exposure region, the wafer stages 52A and 52B need to be swapped.

Figure 13B:
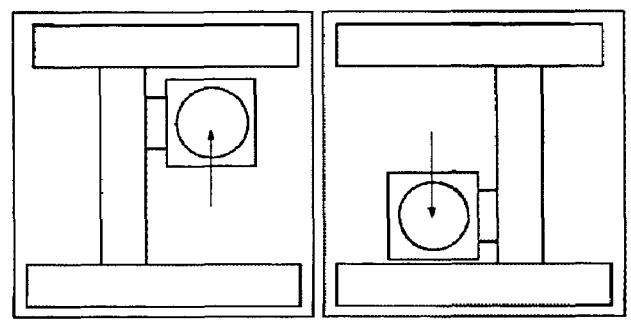
Figure 13C:
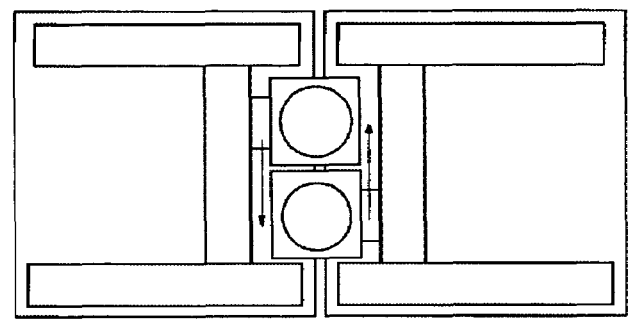
Figure 13D:
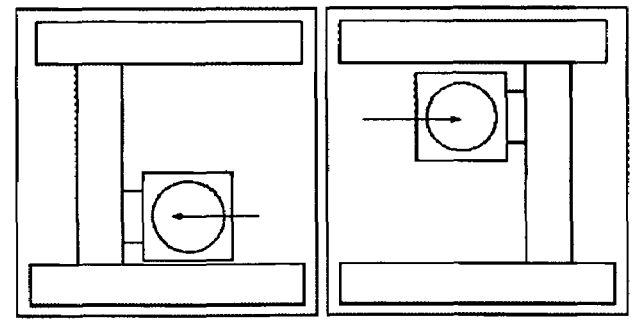

Accordingly, first, the wafer stages 52A and 52B are moved by the Y-driving mechanism 51 in the +Y-direction and the −Y-direction to positions such that they will not touch later, as shown in FIG. 13B. The wafer stages 52A and 52B are then moved by the X-driving mechanism 53 in the +X-direction and the −X-direction to positions such that they can be swapped, as shown in FIG. 13C. Subsequently, movable portions of the Y-driving mechanism 51 are disconnected, are swapped, and are then connected again, as shown in FIG. 13C. By changing the places of the movable portions in this way, the wafer stages 52A and 52B can be swapped. After swapping, the wafer stages 52A and 52B are respectively moved to the exposure region and the alignment region, as shown in FIG. 13D.

In the stage device having guides, the wafer stages can also be stably supported above the bases even during swapping while reducing the influence of vibration therebetween, in a manner similar to that in the first and second embodiments.

Fourth Exemplary Embodiment

Figure 14A:
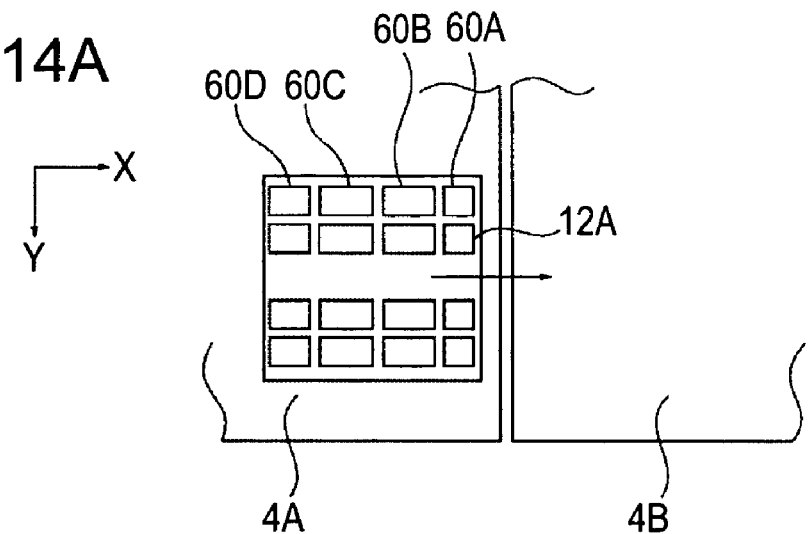
FIGS. 14A to 14C are explanatory views of an exemplary stage device using porous gas bearings.
Figure 14B:
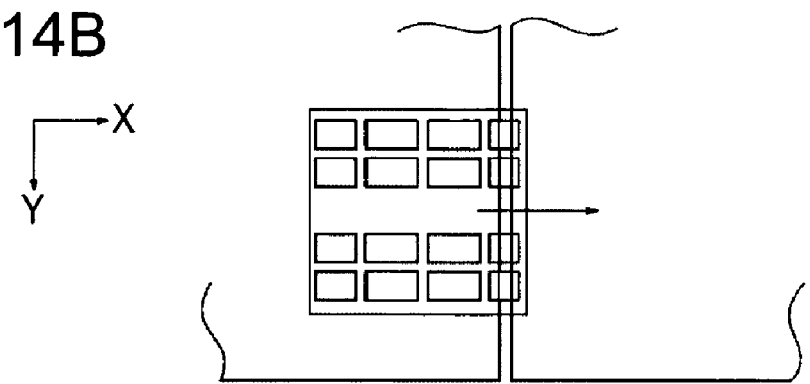
Figure 14C:
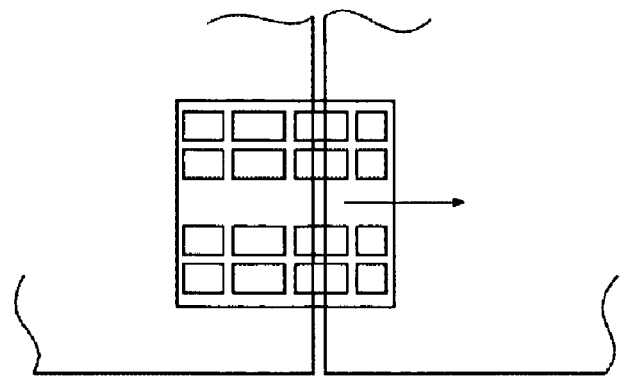

While the surface restriction gas bearing is used in the above first to third embodiments, it may be replaced with a porous gas bearing. FIGS. 14A to 14C show a state in which a wafer stage 12A moves between two bases 4A and 4B. A gas bearing includes a plurality of pads 60 made of a porous material. Each of the pads 60 includes sections 60A to 60D that are separate in the X-direction. In other words, the sections 60A and 60D are separately arranged in the X-direction so that, when a part of the gas bearing (section 60A) lies in the space between the bases 4A and 4B, the other part (sections 60B to 60D) do not lie in the space.

When the wafer stage 12A moves from a state shown in FIG. 14A to a state shown in FIG. 14B, gas leaks from the space between the bases 4A and 4B, and the support rigidity of the gas bearing is reduced. However, a plurality of pad sections 60 are separately arranged in the X-direction in the fourth embodiment, and therefore, the support rigidity can be maintained.

Since the pad sections 60 are provided on both sides in the X-direction of the center of gravity of the wafer stage 12A, the wafer stage 12A can stably move between the bases 4A and 4B. When the wafer stage 12A moves from the state shown in FIG. 14B to a state shown in FIG. 14C, the support rigidity is recovered by the pad sections 60A.

Method for Manufacturing Device with the Above Exposure Apparatus

Figure 15:
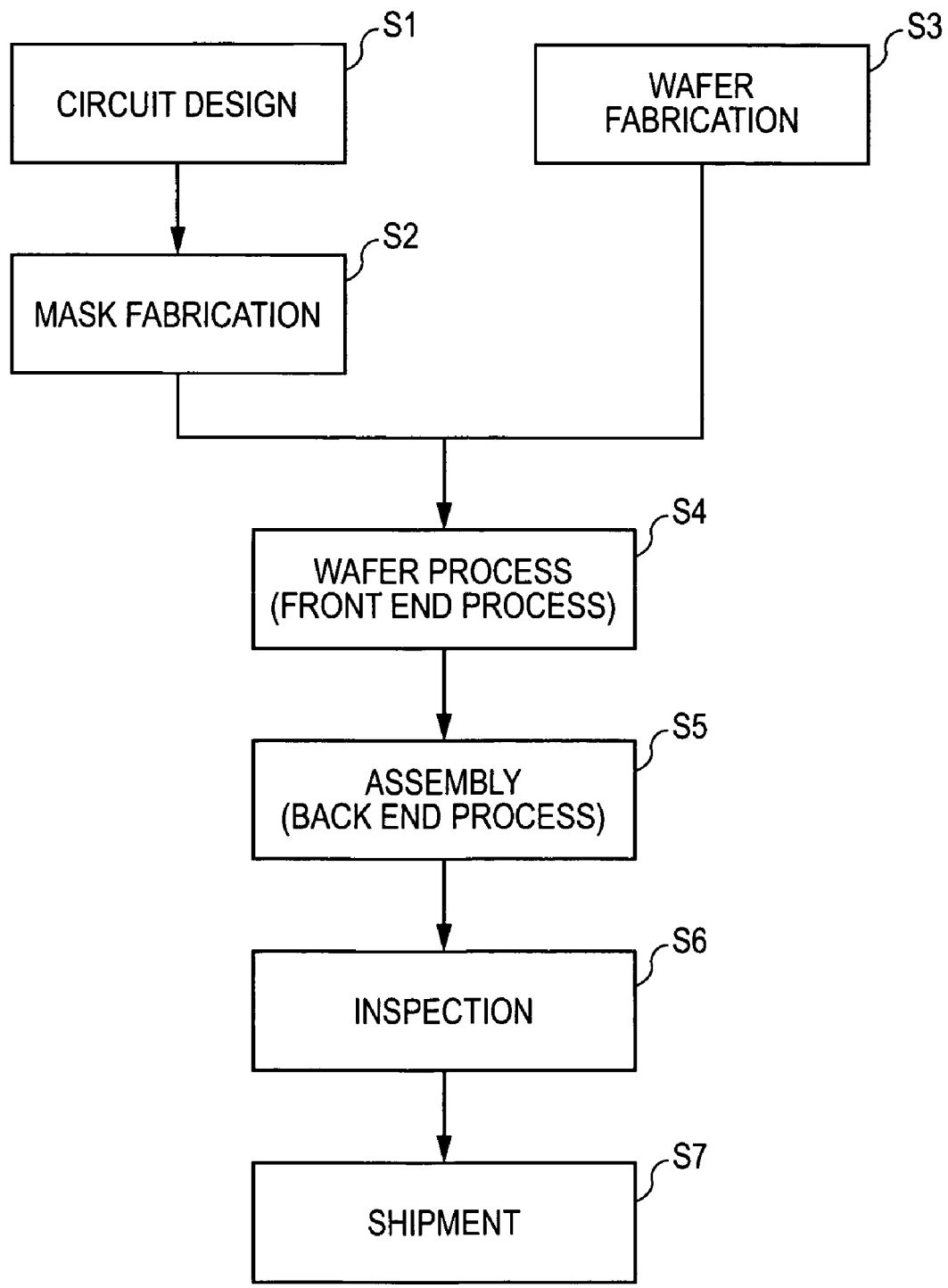
FIG. 15 is a flowchart showing an exemplary device manufacturing method.

A description will now be given of an exemplary semiconductor-device manufacturing method using the above-described exposure apparatus. FIG. 15 is a flowchart showing the general semiconductor-device manufacturing procedure. In Step S1 (circuit design), a circuit pattern of a semiconductor device is designed. In Step S2 (mask fabrication), a mask having the designed circuit pattern is fabricated.

On the other hand, in Step S3 (wafer fabrication), a wafer is made of, for example, silicon. In Step S4 (wafer process) called a front end process, an actual circuit is formed on the wafer by lithography using the fabricated mask and wafer with the exposure apparatus. In Step S5 (assembly) called a back end process, a semiconductor chip is produced by using the wafer fabricated in Step S4. The back end process includes, for example, an assembly step (dicing and bonding) and a packaging step (chip encapsulation). In Step S6 (inspection), the semiconductor device produced in Step S5 is subjected to inspections such as an operation confirmation test and a durability test. A semiconductor device is completed through the above steps, and is then shipped in Step S7.

Figure 16:
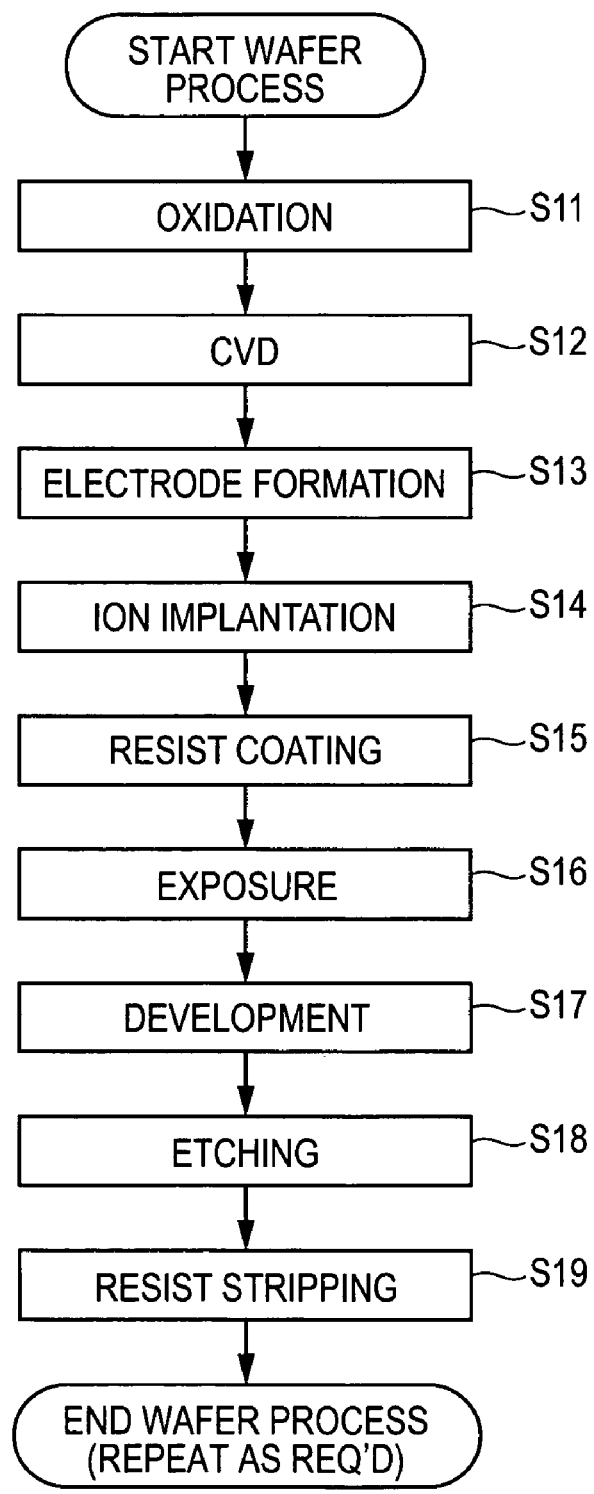
FIG. 16 is a flowchart showing an exemplary wafer process.

The wafer process in Step S4 includes the following steps shown in FIG. 16. In Step S11 (oxidation), the surface of the wafer is oxidized. In Step S12 (CVD), an insulating film is formed on the wafer surface. In Step S13 (electrode formation), electrodes are formed on the wafer by vapor deposition. In Step S14 (ion implantation), ions are implanted into the wafer. In Step S15 (resist coating), a sensitive material is applied on the wafer. In Step S16 (exposure), the circuit pattern of the mask is transferred onto the wafer by exposure with the exposure apparatus after resist coating. In Step S17 (development), the exposed wafer is developed. In Step S18 (etching), a portion other than the developed resist image is removed. In Step S19 (resist stripping), the resist, which has become unnecessary after etching, is removed. By repeating these steps, multiple circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2004-342251 filed Nov. 26, 2004, which is hereby incorporated by reference herein in its entirety.

What is claimed is:

1. A stage device comprising:
   a plurality of bases positioned adjacent each other with a space therebetween;
   a plurality of stages movable along upper surfaces of the bases;
   a surface motor configured to drive said stages; and
   a plurality of gas bearings provided in each of the stages,
   wherein the gas bearings are arranged so that, when at least one of the gas bearings opposes the space, the other of the gas bearings does not oppose the space.

2. The stage device according to claim 1, wherein each of the gas bearings includes a gas supply hole and a groove provided around the gas supply hole.

3. The stage device according to claim 1, wherein the gas bearings are arranged symmetrically with respect to a center region of each of the stages.

4. An exposure apparatus that exposes a substrate to be patterned and that positions the substrate by a stage device, wherein the stage device comprises:
   a plurality of bases positioned adjacent each other with a space therebetween;
   a plurality of stages movable along upper surfaces of the bases;
   a surface motor configured to drive said stages; and
   a plurality of gas bearings provided in each of the stages,
   wherein the gas bearings are arranged so that, when at least one of the gas bearings opposes the space, the other of the gas bearings does not oppose the space.

5. A device manufacturing method comprising:
   exposing a substrate with an exposure apparatus; and
   developing the exposed substrate;
   wherein the exposure apparatus is configured to position the substrate by a stage device,
   wherein the stage device includes a plurality of bases positioned adjacent each other with a space therebetween;
   a plurality of stages movable along upper surfaces of the bases;
   a surface motor configured to drive said stages; and
   a plurality of gas bearings provided in each of the stages,
   wherein the gas bearings are arranged so that, when at least one of the gas bearings opposes the space, the other of the gas bearings does not oppose the space.

6. A stage device comprising:
   a plurality of bases positioned adjacent each other with a space therebetween;
   a plurality of stages movable along upper surfaces of the bases;
   a surface motor configured to drive said stages; and
   a plurality of gas bearings provided in each of the stages,
   wherein said gas bearings are spaced from each other in the direction in which the bases are adjacent to each other, and
   the space between the gas bearings is longer than the space between the bases.

7. An exposure apparatus that exposes a substrate to be patterned and that positions the substrate by a stage device, wherein the stage device comprises:
   a plurality of bases positioned adjacent each other with a space therebetween;
   a plurality of stages movable along upper surfaces of the bases;
   a surface motor configured to drive said stages; and
   a plurality of gas bearings provided in each of the stages,
   wherein the gas bearings are spaced from each other in the direction in which the bases are adjacent to each other, and
   the space between the gas bearings is longer than the space between the bases.

8. A device manufacturing method comprising:
   exposing a substrate with an exposure apparatus; and
   developing the exposed substrate,
   wherein the exposure apparatus is configured to position the substrate by a stage device,
   wherein the stage device includes a plurality of bases positioned adjacent each other with a space therebetween;
   a plurality of stages movable along upper surfaces of the bases;
   a surface motor configured to drive said stages; and
   a plurality of gas bearings provided in each of the stages,
   wherein the gas bearing are spaced from each other in the direction in which the bases are adjacent to each other, and
   the space between the gas bearings is longer than the space between the bases.

* * * * *